United States Patent
Hong

(10) Patent No.: US 9,390,806 B1
(45) Date of Patent: Jul. 12, 2016

(54) MEMORY SYSTEM AND METHOD OF OPERATING THE SAME

(71) Applicant: SK hynix Inc., Gyeonggi-do (KR)

(72) Inventor: Ji-Man Hong, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 0 days.

(21) Appl. No.: 14/717,623

(22) Filed: May 20, 2015

(30) Foreign Application Priority Data

Dec. 17, 2014 (KR) .................. 10-2014-0182726

(51) Int. Cl.
  *G11C 7/04* (2006.01)
  *G11C 16/26* (2006.01)
  *G11C 16/10* (2006.01)

(52) U.S. Cl.
  CPC .............. *G11C 16/26* (2013.01); *G11C 16/10* (2013.01)

(58) Field of Classification Search
  CPC ......... G11C 7/08; G11C 7/062; G11C 7/1051
  USPC .................................. 365/211, 207, 189.15
  See application file for complete search history.

(56) References Cited

U.S. PATENT DOCUMENTS

| 8,514,646 | B1 | 8/2013 | Nan |
| 2003/0189856 | A1 | 10/2003 | Cho et al. |
| 2010/0061141 | A1 | 3/2010 | Hwang |
| 2010/0110793 | A1* | 5/2010 | Kim ................. G11C 5/143 365/185.18 |
| 2010/0162012 | A1 | 6/2010 | Cornwell et al. |
| 2011/0103140 | A1 | 5/2011 | Chung |
| 2012/0002314 | A1 | 1/2012 | Huang et al. |
| 2012/0081810 | A1 | 4/2012 | Kawabe |
| 2012/0218823 | A1* | 8/2012 | Tanzawa ............ G11C 5/14 365/185.18 |
| 2012/0287711 | A1 | 11/2012 | Kim et al. |
| 2013/0194872 | A1* | 8/2013 | Sim .................. G11C 16/26 365/185.17 |

* cited by examiner

*Primary Examiner* — Han Yang
(74) *Attorney, Agent, or Firm* — IP & T Group LLP

(57) ABSTRACT

A memory system includes a memory device, a plurality of memory blocks which include a plurality of memory cells electrically coupled to a plurality of word lines and store data requested from a host; and a controller suitable for programming first data in a first memory cell among the plurality of memory cells based on a write command received from the host, determining a read voltage of the first memory cell, and reading the first data programmed in the first memory cell based on the read voltage in response to a read command received from the host.

19 Claims, 11 Drawing Sheets

MEMORY SYSTEM AND METHOD OF OPERATING THE SAME

CROSS-REFERENCE TO RELATED APPLICATION

This application claims priority under 35 U.S.C. §119 to Korean Patent Application No. 10-2014-0182726 filed on Dec. 17, 2014 in the Korean Intellectual Property Office, the disclosure of which is incorporated herein by reference in its entirety.

TECHNICAL FIELD

Exemplary embodiments of the present invention relate to a memory system and, more particularly, to a memory system which reads data from a memory device, and a method of operating the same.

DISCUSSION OF THE RELATED ART

Recently, the paradigm for the computing environment has changed to ubiquitous computing, so that computer systems can be used anytime and anywhere. Because of this, the use of portable electronic devices such as mobile phones, digital cameras, and notebook computers has rapidly increased. Such portable electronic devices generally use memory systems with memory devices, that is, data storage devices. Data storage devices are used as main memory or auxiliary memory devices within the portable electronic devices.

Data storage devices with memory devices are advantageous because, since there are no moving parts, stability and durability is excellent, information access speed is high, and power consumption is low. Examples of data storage devices having memory systems with these advantages include universal serial bus (USB) memory devices, memory cards having various interfaces, and solid state drives (SSD).

SUMMARY

Various embodiments are directed to a memory system which may normally read data from a memory device, and a method of operating the same.

In an embodiment, a memory system may include: a memory device having a plurality of memory blocks which include a plurality of memory cells electrically coupled to a plurality of word lines and store data requested from a host; and a controller suitable for programming first data in a first memory cell among the plurality of memory cells based on a write command received from the host, determining a read voltage of the first memory cell, and reading the first data programmed in the first memory cell based on the read voltage in response to a read command received from the host.

The controller may determine the read voltage by checking a data program temperature when programming the first data in the first memory cell and checking a data read temperature when reading the programmed first data from the first memory cell.

The controller may determine the read voltage by calculating a read voltage offset between a first read voltage at the data program temperature and a second read voltage at the data read temperature, for the first memory cell, and compensating the second read voltage based on the read voltage offset.

The controller may check a first threshold voltage distribution and a first read retry table at the data program temperature, for the first memory cell.

The controller may read information on the first read voltage, the first threshold voltage distribution, and the first read retry table, from a flag cell included in the memory device.

The controller may read the first data programmed in the first memory cell at read bias level's included in the first read retry table, and determine a read bias level at which the number of read fail bits of the first data is smallest, as the second read voltage.

The controller may calculate the read voltage offset based on a read bias level difference between the first read voltage and the second read voltage.

The controller may check a second threshold voltage distribution and a second read retry table at the data read temperature, for the first memory cell, based on the second read voltage.

The read command may include information on the data read temperature.

The memory system may further include a temperature sensor suitable for sensing the data read temperature, and providing information on the data read temperature to the controller.

In an embodiment, a method of operating a memory system may include: programming first data based on to a write command received from a host, in a first memory cell among a plurality of memory cells which are included in a plurality of blocks of a memory device and are electrically coupled to a plurality of word lines; determining a read voltage of the first memory cell; and reading the first data programmed in the first memory cell, based on the read voltage in response to a read command received from the host.

The determining of the read voltage in the first memory cell may include checking a data program temperature when programming the first data in the first memory cell and checking a data read temperature when reading the programmed first data from the first memory cell.

The determining of the read voltage of the first memory cell may further include calculating a read voltage offset between a first read voltage at the data program temperature and a second read voltage at the data read temperature, for the first memory cell; and compensating the second read voltage based on the read voltage offset, and determining the read voltage of the first memory cell.

The checking of the data program temperature may include checking a first threshold voltage distribution and a first read retry table at the data program temperature, for the first memory cell.

The checking of the first threshold voltage distribution and the first read retry table may include reading information on the first read voltage, the first threshold voltage distribution and the first read retry table, from a flag cell included in the memory device.

The checking of the data read temperature may include reading the first data programmed in the first memory cell at read bias levels included in the first read retry table; and determining a read bias level at which the number of read fail bits of the first data is smallest, as the second read voltage.

The calculating of the read voltage offset may include calculating the read voltage offset based on a read bias level difference between the first read voltage and the second read voltage.

The checking of the data read temperature may further include checking a second threshold voltage distribution and a second read retry table at the data read temperature, for the first memory cell, based on the second read voltage.

The read command may include information on the data read temperature.

The checking of the data read temperature may include receiving information on the data read temperature from a temperature sensor of the memory device.

DETAILED DESCRIPTION

Figure 1:
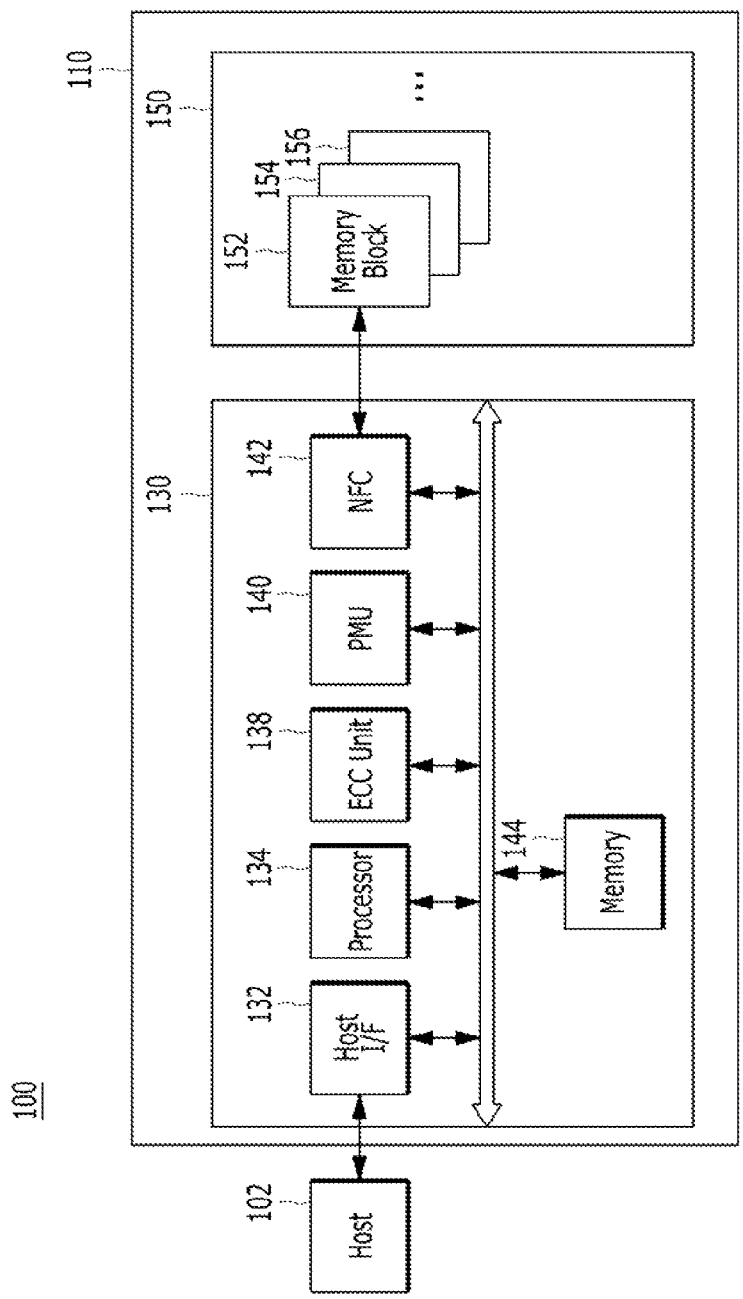
FIG. 1 is a diagram illustrating a data processing system including a memory system in accordance with an embodiment.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated in order to clearly illustrate features of the embodiments. When an element is referred to as being connected or coupled to another element, it should be understood that the former can be directly connected or coupled to the latter, or electrically connected or coupled to the latter via an intervening element therebetween. Furthermore, when it is described that one "comprises" (or "includes") or "has" some elements, it should be understood that it may comprise (or include) or have only those elements, or it may comprise (or include) or have other elements as well as those elements if there is no specific limitation. The terms of a singular form may include plural forms unless referred to the contrary.

FIG. 1 is a diagram illustrating a data processing system including a memory system in accordance with an embodiment of the present invention.

Referring to FIG. 1, the data processing system 100 may include a host 102 and a memory system 110.

The host 102 includes, for example, a portable electronic device such as a mobile phone, an MP3 player and a laptop computer or an electronic device such as a desktop computer, a game player, a TV and a projector.

The memory system 110 operates in response to a request from the host 102, and in particular, stores data to be accessed by the host 102. In other words, the memory system 110 may be used as a main memory device or an auxiliary memory device of the host 102. The memory system 110 may be implemented with any one of various kinds of storage devices, according to the protocol of a host interface to be electrically coupled with the host 102. For example, the memory system 110 may be implemented with any one of various kinds of storage devices such as a solid state drive (SSD), a multimedia card (MMC), an embedded MMC (eMMC), a reduced size MMC (RS-MMC) and a micro-MMC, a secure digital (SD) card, a mini-SD and a micro-SD, a universal serial bus (USB) storage device, a universal flash storage (UFS) device, a compact flash (CF) card, a smart media (SM) card, a memory stick, and so forth.

The storage devices which realize the memory system 110 may be implemented with a volatile memory device such as a dynamic random access memory (DRAM) and a static random access memory (SRAM), or a nonvolatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetic RAM (MRAM) and a resistive RAM (RRAM).

The memory system 110 includes a memory device 150 which stores data to be accessed by the host 102, and a controller 130 which controls storage of data in the memory device 150.

The controller 130 and the memory device 150 may be integrated into one semiconductor device. For instance, the controller 130 and the memory device 150 may be integrated into one semiconductor device and configure a solid state drive (SSD). When the memory system 110 is used as an SSD, the operation speed of the host 102, which is electrically coupled with the memory system 110 may be significantly increased.

The controller 130 and the memory device 150 may be integrated into one semiconductor device and configure a memory card. For example, the controller 130 and the memory card 150 may be integrated into one semiconductor device and configure a memory card such as a Personal Computer Memory Card International Association (PCMCIA) card, a compact flash (CF) card, a smart media (SM) card, a memory stick, a multimedia card (MMC), an RS-MMC and a micro-MMC, a secure digital (SD) card, a mini-SD, a micro-SD and an SDHC, and a universal flash storage (UFS) device.

For another instance, the memory system 110 may configure a computer, an ultra mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation device, a black box, a digital camera, a digital multimedia broadcasting (DMB) player, a three-dimensional (3D) television, a smart television, a digital audio recorder, a digital audio player, a digital picture recorder, a digital picture player, a digital video recorder, a digital video player a storage configuring a data center, a device capable of transmitting and receiving information under a wireless environment, one of various electronic devices configuring a home network, one of various electronic devices configuring a computer network, one of various electronic devices configuring a telematics network, an RFID device, or one of various component elements configuring a computing system.

The memory device 150 of the memory system 110 may retain stored data when power supply is interrupted and, in particular, store the data provided from the host 102 during a write operation, and provide stored data to the host 102 during a read operation. The memory device 150 includes a plurality of memory blocks 152, 154 and 156. Each of the memory blocks 152, 154 and 156 includes a plurality of pages. Each of the pages includes a plurality of memory cells to which a plurality of word lines (WL) are electrically coupled. The memory device 150 may be a nonvolatile memory device, for example, a flash memory. The flash memory may have a three-dimensional (3D) stack structure. Since the structure of the memory device 150 and the three-dimensional (3D) stack structure of the memory device 150 will be described later in detail with reference to FIGS. 2 to 11, detailed descriptions thereof will be omitted for now.

The controller 130 of the memory system 110 controls the memory device 150 in response to a request from the host 102. For example, the controller 130 provides the data read from the memory device 150, to the host 102, and stores the data provided from the host 102, in the memory device 150. To this end, the controller 130 controls overall operations of the memory device 150, such as read, write, program and erase operations.

In detail, the controller 130 includes a host interface unit 132, a processor 134, an error correction code (ECC) unit 138, a power management unit 140, a NAND flash controller 142, and a memory 144.

The host interface unit 132 processes commands and data provided from the host 102, and may be configured to communicate with the host 102 through at least one of various interface protocols such as a universal serial bus (USB), a multimedia card (MMC), a peripheral component interconnect-express (PCI-E), a serial-attached SCSI (SAS), a serial advanced technology attachment (SATA), a parallel advanced technology attachment (PATH), a small computer system interface (SCSI), an enhanced small disk interface (ESDI), and an integrated drive electronics (IDE).

The ECC unit 138 detects and corrects an error included in the data read from the memory device 150 during the read operation. That is, after performing an error correction decoding operation on the data read from the memory device 150, the ECC unit 138 may determine whether the error correction decoding operation has succeeded, output an indication signal in response to a determination result, and correct an error bit of the read data based on a parity bit generated by an ECC encoding process. The ECC unit 138 may not correct error bits if the number of the error bits is equal to or greater than a threshold number of correctable error bits, and may output an error correction fail signal indicating that it is incapable of correcting the error bits.

The ECC unit 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC unit 138 may include all circuits, systems or devices for the error correction operation.

The NFC 142 serves as a memory interface between the controller 130 and the memory device 150 to allow the controller 130 to control the memory device 150 in response to a request from the host 102. The NFC 142 generates control signals for the memory device 150 and processes data under the control of the processor 134, when the memory device 150 is a flash memory and, in particular, when the memory device 150 is a NAND flash memory.

The memory 144 serves as a working memory of the memory system 110 and the controller 130, and stores data for driving the memory system 110 and the controller 130. In detail, when the controller 130 controls the memory device 150 in response to a request from the host 102, for example, when the controller 130 provides the data read from the memory device 150 to the host 102, and stores the data provided from the host 102 in the memory device 150, and, to this end, when the controller 130 controls the operations of the memory device 150, such as read, write, program and erase operations, the memory 144 stores data needed to allow such operations to be performed by the memory system 110, that is, between the controller 130 and the memory device 150.

The memory 144 may be implemented with volatile memory. For example, the memory 144 may be implemented with a static random access memory (SRAM) or a dynamic random access memory (DRAM). As described above, the memory 144 stores data needed to perform the read and write operations between the host 102 and the memory device 150. To store the data, the memory 144 includes a program memory, a data memory, a write buffer, a read buffer, map buffer, and so forth.

The processor 134 controls general operations of the memory system 110, and controls a write operation or a read operation for the memory device 150, in response to, a write request or a read request from the host 102. The processor 134 drives firmware which is referred to as a flash translation layer (FTL), to control the general operations of the memory system 110. The processor 134 may be implemented with a microprocessor or a central processing unit (CPU).

A management unit (not shown) for performing "bad management," for example, bad block management, of the memory device 150 is included in the processor 134. The management unit checks the plurality of memory blocks included in the memory device 150, finds those that are bad (are in unsatisfactory condition for further use) and performs bad block management. When the memory device 150 is a flash memory, for example, a NAND flash memory, a program fail may occur during the write operation, for example, during the program operation, due to characteristics of a NAND logic function. "Bad management," that is, bad block management means processing memory blocks in which a program failure has occurred, as bad, and program the data that has failed to be programmed in a new memory block. Hereinbelow, the memory device in the memory system in accordance with an embodiment will be described in detail with reference to FIGS. 2 to 11.

Figure 2:
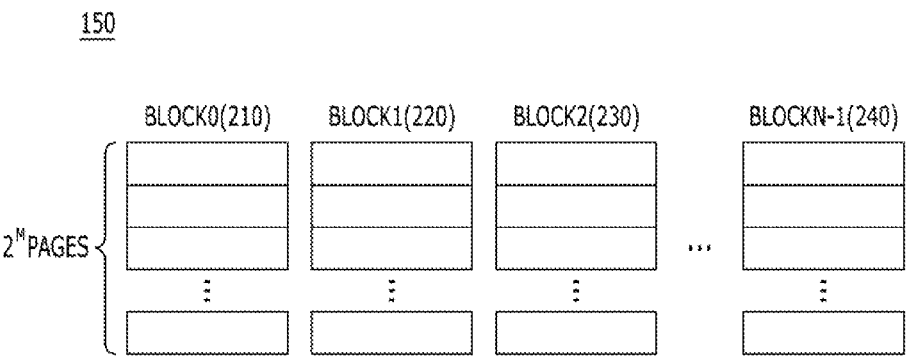
FIG. 2 is a diagram illustrating a memory device in the memory system shown in FIG. 1.

FIG. 2 is a diagram illustrating the memory device 150 in the memory system 110 shown in FIG. 1.

Referring to FIG. 2, the memory device 150 includes a plurality of memory blocks, for example, a zeroth block (BLOCK0) 210, a first block (BLOCK1) 220, a second block (BLOCK2) 230 and an N-1$^{th}$ block (BLOCKN-1) 240. Each of the blocks 210, 220, 230 and 240 includes a plurality of pages, for example, $2^M$ number of pages ($2^M$PAGES). While it is described for the sake of convenience in explanation that each of the plurality of memory blocks includes $2^M$ number of pages, it is to be noted that each of the plurality of memory blocks may include M number of pages. Each of the pages includes a plurality of memory cells to which a plurality of word lines (WL) are electrically coupled.

Also, the memory device 150 may include a plurality of memory blocks, as single level cell (SLC) memory blocks and multi-level cell (MLC) memory blocks, according to the number of bits which may be stored or expressed in each memory cell. The SLC memory block includes a plurality of pages which are implemented with memory cells each capable of storing 1-bit data, and may have high data calculation performance and superior durability. The MLC memory block includes a plurality of pages which are implemented with memory cells each capable of storing multi-bit data, for example, two or more-bit data, and may have a data storage space larger than the SLC memory block, that is, may be highly integrated. An MLC memory block including a plurality of pages which are implemented with memory cells that are each capable of storing 3-bit data may be defined as a triple level cell (TLC) memory block.

Each of the memory blocks 210, 220, 230 and 240 stores the data provided from the host device 102 of FIG. 1 during a write operation, and provides stored data to the host 102 during a read operation.

Figure 3:
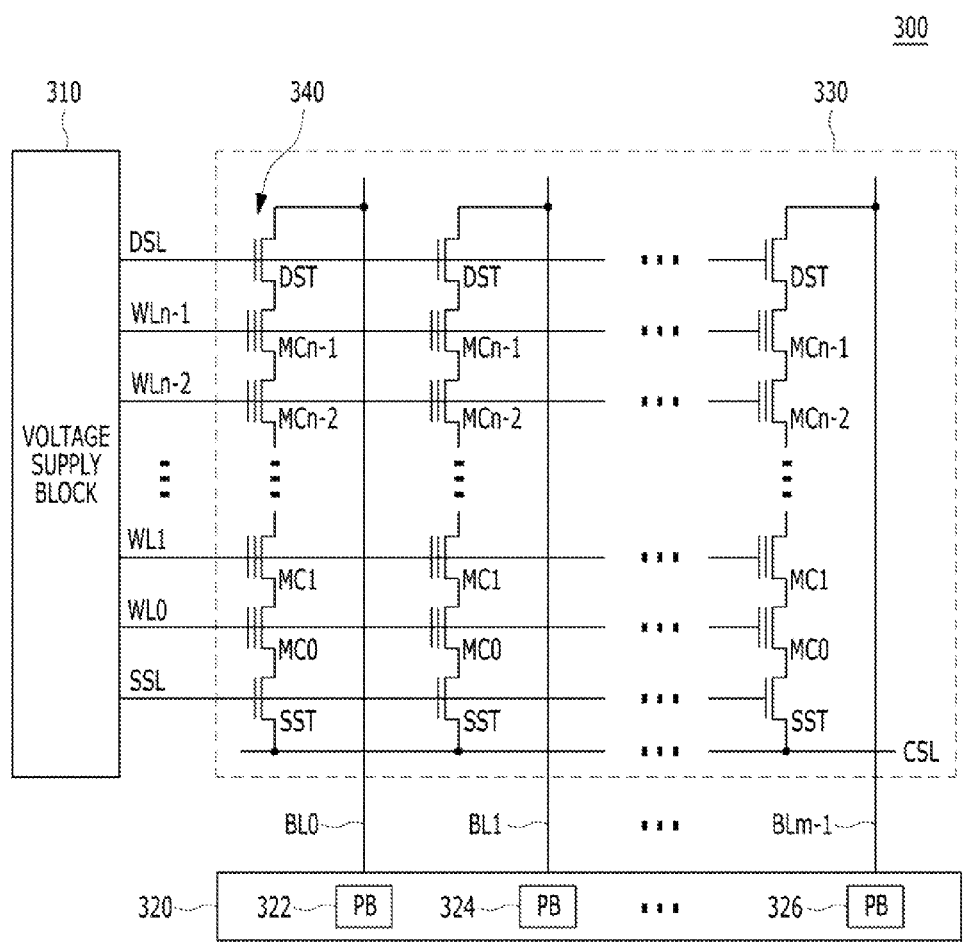
FIG. 3 is a circuit diagram illustrating a memory block in a memory device in accordance with an embodiment.

FIG. 3 is a circuit diagram illustrating a memory block in a memory device in accordance with an embodiment of the present invention.

Referring to FIG. 3, the memory block 330 of the memory device 300 may include a plurality of cell strings 340 which are electrically coupled to bit lines BL0 to BLm−1, respectively. The cell string 340 of each column may include at least one drain select transistor DST and at least one source select transistor SST. A plurality of memory cells or a plurality of memory cell transistors MC0 to MCn−1 may be electrically coupled in series between the select transistors DST and SST. The respective memory cells MC0 to MCn−1 may be configured by multi-level cells (MLC) each of which stores data information of a plurality of bits. The strings 340 may be electrically coupled to the corresponding bit lines BL0 to BLm−1, respectively. For reference, in FIG. 3, 'DSL' denotes a drain select line, 'SSL' denotes a source select line, and 'CSL' denotes a common source line.

While FIG. 3 shows, as an example, the memory block 330 which is configured by NAND flash memory cells, it is to be noted that the memory block 330 of the memory device 300 in accordance with the embodiment is not limited to NAND flash memory and may be realized by NOR flash memory, hybrid flash memory in which at least two kinds of memory cells are combined, or one-NAND flash memory in which a controller is built in a memory chip. The operational characteristics of a semiconductor device may be applied to not only a flash memory device in which a charge storing layer is configured by conductive floating gates but also a charge trap flash (CTF) in which a charge storing layer is configured by a dielectric layer.

A voltage supply block 310 of the memory device 300 may provide word line voltages, for example, a program voltage, a read voltage and a pass voltage, to be supplied to respective word lines according to an operation mode and voltages to be supplied to bulks, for example, well regions in which the memory cells are formed. The voltage supply block 310 may perform a voltage generating operation under the control of a control circuit (not shown). The voltage supply block 310 may generate a plurality of variable read voltages to generate a plurality of read data, select one of the memory blocks or sectors of a memory cell array under the control of the control circuit, select one of the word lines of the selected memory block, and provide the word line voltages to the selected word line and unselected word lines.

A read/write circuit 320 of the memory device 300 is controlled by the control circuit, and may serve as a sense amplifier or a write driver according to an operation mode. For example, during a verification/normal read operation, the read/write circuit 320 may serve as a sense amplifier for reading data from the memory cell array. Also, during a program operation, the read/write circuit 320 may serve as a write driver which drives bit lines according to data to be stored in the memory cell array. The read/write circuit 320 may receive data to be written in the memory cell array from a buffer (not shown), during the program operation, and may drive the bit fines according to the inputted data. To this end, the read/write circuit 320 may include a plurality of page buffers 322, 324 and 326 respectively corresponding to columns (or bit lines) or pairs of columns (or pairs of bit lines), and a plurality of latches (not shown) may be included in each of the page buffers 322, 324 and 326.

Hereinbelow, detailed descriptions will be made with reference to FIGS. 4 to 11, for the memory device 150 in the memory system in accordance with an embodiment, when the memory device is implemented with a three-dimensional (3D) nonvolatile memory device.

Figure 4:
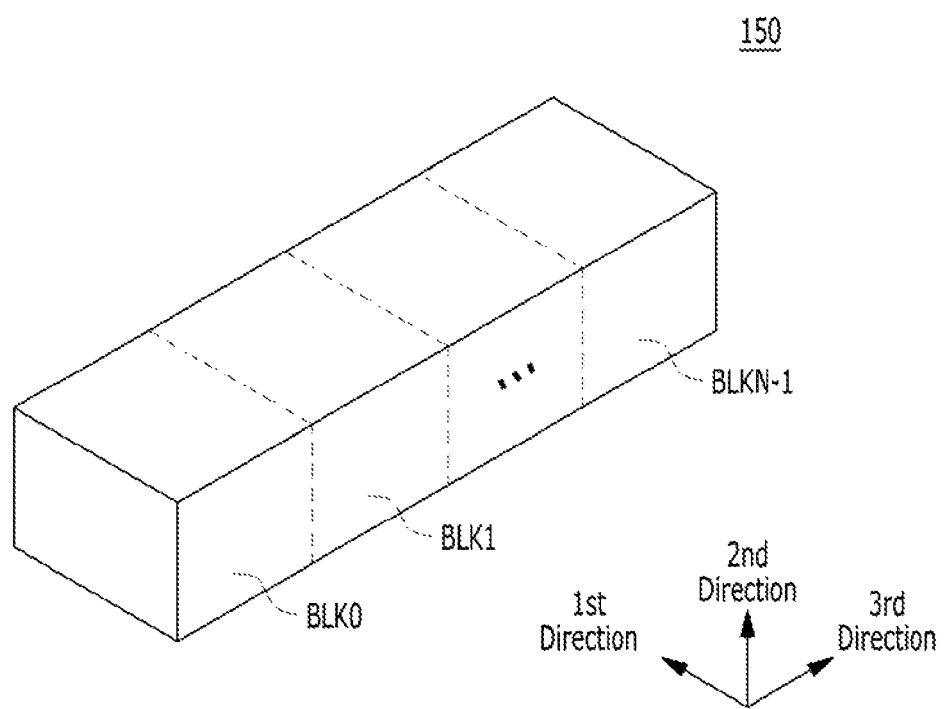
FIGS. 4 to 11 are diagrams schematically illustrating a memory device in a memory system in accordance with an embodiment.

FIG. 4 is a block diagram illustrating the memory block of the memory device 150 shown in FIG. 2.

Referring to FIG. 4, the memory device 150 may include a plurality of memory blocks BLK0 to BLKN−1, and each of the memory blocks BLK0 to BLKN−1 may be realized in a three-dimensional (3D) structure or a vertical structure. For example, the respective memory blocks BLK0 to BLKN−1 may include structures which extend in first to third directions, for example, an x-axis direction, a y-axis direction and a z-axis direction.

The respective memory blocks BLK0 to BLKN−1 may include a plurality of NAND strings NS which extend in the second direction. The plurality of NAND strings NS may be provided in the first direction and the third direction. Each NAND string NS may be electrically coupled to a bit line BL, at least one source select line SSL, at least one ground select line GSL, a plurality of word lines WL, at least one dummy word line DWL, and a common source line CSL. Namely, the respective memory blocks BLK0 to BLKN−1 may be electrically coupled to a plurality of bit lines BL, a plurality of source select lines SSL, a plurality of ground select lines GSL, a plurality of word lines WL, a plurality of dummy word lines DWL, and a plurality of common source lines CSL.

Figure 5:
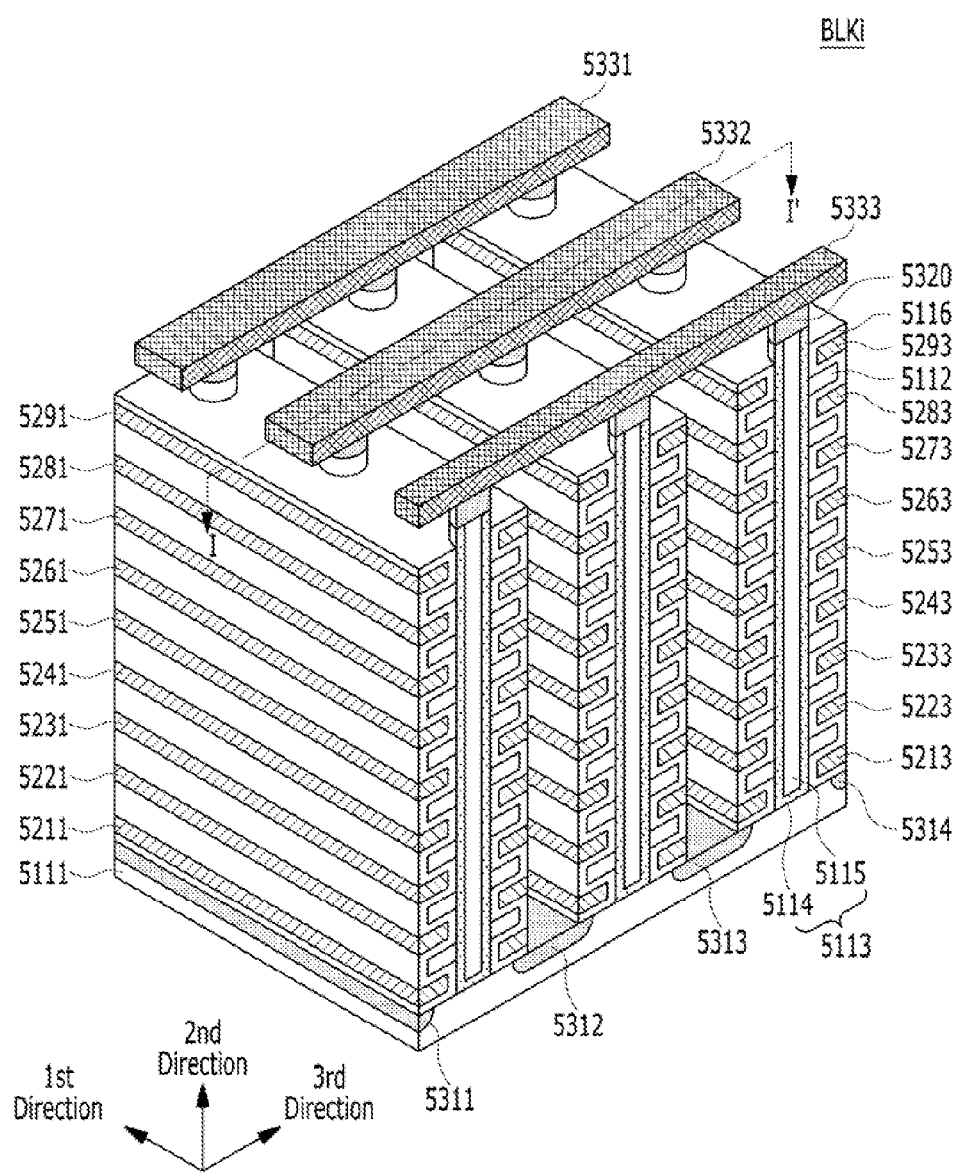
Figure 6:
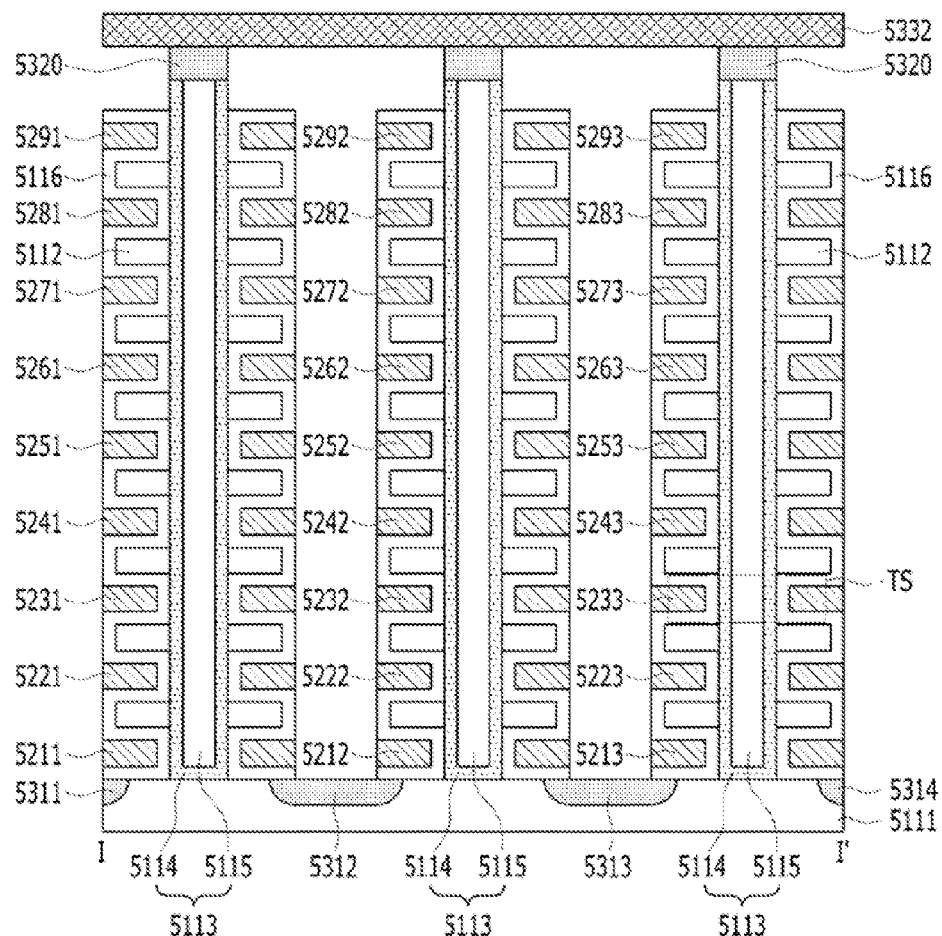

FIG. 5 is a perspective view of a certain memory block of the plural memory blocks BLK0 to BLKN−1 shown in FIG. 4. FIG. 6 is a cross-sectional view taken along a line I-I' of the memory block BLKi shown in FIG. 5.

Referring to FIGS. 5 and 6, the certain memory block BLKi among the plurality of memory blocks of the memory device 150 may include a structure which extends in the first to third directions.

A substrate 5111 may be provided. The substrate 5111 may include a silicon material doped with a first type impurity. For example, the substrate 5111 may include a silicon material doped with a p-type impurity or may be a p-type well, for example, a pocket p-well and include an n-type well which surrounds the p-type well. While it is assumed in the embodiment for the sake of convenience in explanation that the substrate 5111 is p-type silicon, it is to be noted that the substrate 5111 is not limited to being p-type silicon.

A plurality of doping regions 5311 to 5314 which extend in the first direction may be provided over the substrate 5111. For example, the plurality of doping regions 5311 to 5314 may contain a second type of impurity that is different from the substrate 5111. For example, the plurality of doping regions 5311 to 5314 may be doped with an n-type impurity. While it is assumed in the embodiment for the sake of convenience in explanation that first to fourth doping regions 5311 to 5314 are n-type, it is to be noted that the first to fourth doping regions 5311 to 5314 are not limited to the n-type.

In the region over the substrate 5111 between the first and second doping regions 5311 and 5312, a plurality of dielectric materials 5112 which extend in the first direction may be sequentially provided in the second direction. For example, the plurality of dielectric materials 5112 and the substrate 5111 may be separated from one another by a predetermined distance in the second direction. For example, the plurality of dielectric materials 5112 may be separated from one another by a predetermined distance in the second direction. For example, the dielectric materials 5112 may include a dielectric material such as silicon oxide.

In the region over the substrate 5111 between the first and second doping regions 5311 and 5312, a plurality of pillars 5113 which are sequentially disposed in the first direction and pass through the dielectric materials 5112 in the second direction may be provided. For example, the plurality of pillars 5113 may respectively pass through the dielectric materials 5112 and may be electrically coupled with the substrate 5111. For example, each pillar 5113 may be configured by a plurality of materials. For example, a surface layer 5114 of each pillar 5113 may include a silicon material doped with the first type of impurity. For example, the surface layer 5114 of each pillar 5113 may include a silicon material doped with the same type of impurity as the substrate 5111. While it is assumed in the embodiment for the sake of convenience in explanation that the surface layer 5114 of each pillar 5113 includes p-type silicon, it is to be noted that the surface layer 5114 of each pillar 5113 is not limited to p-type silicon.

An inner layer 5115 of each pillar 5113 may be formed of a dielectric material. For example, the inner layer 5115 of each pillar 5113 may be filled by a dielectric material such as silicon oxide.

In the region between the first and second doping regions 5311 and 5312, a dielectric layer 5116 may be provided along the exposed surfaces of the dielectric materials 5112, the pillars 5113 and the substrate 5111. For example, the thickness of the dielectric layer 5116 may be smaller than half of the distance between the dielectric materials 5112. In other words, a region in which a material other than the dielectric material 5112 and the dielectric layer 5116 may be disposed, may be provided between (i) the dielectric layer 5116 provided over the bottom surface of a first dielectric material of the dielectric materials 5112 and (ii) the dielectric layer 5116 provided over the top surface of a second dielectric material of the dielectric materials 5112. The dielectric materials 5112 lie below the first dielectric material.

In the region between the first and second doping regions 5311 and 5312, conductive materials 5211 to 5291 may be provided over the exposed surface of the dielectric layer 5116. For example, the conductive material 5211 which extends in the first direction may be provided between the dielectric material 5112 adjacent to the substrate 5111 and the substrate 5111. In particular, the conductive material 5211 which extends in the first direction may be provided between (i) the dielectric layer 5116 disposed over the substrate 5111 and (ii) the dielectric layer 5116 disposed over the bottom surface of the dielectric material 5112 adjacent to the substrate 5111.

The conductive material which extends in the first direction may be provided between (i) the dielectric layer 5116 disposed over the top surface of a certain dielectric material of the dielectric materials 5112 and (ii) the dielectric layer 5116 disposed over the bottom surface of another dielectric material of the dielectric materials 5112, which is disposed over the certain dielectric material 5112. For example, the plurality of conductive materials 5221 to 5281 which extend in the first direction may be provided between the dielectric materials 5112. The conductive material 5291 which extends in the first direction may be provided over the uppermost dielectric material 5112. For example, the conductive materials 5211 to 5291 which extend in the first direction may be a metallic material. For example, the conductive materials 5211 to 5291 which extend in the first direction may be a conductive material such as polysilicon.

In the region between the second and third doping regions 5312 and 5313, the same structures as the structures between the first and second doping regions 5311 and 5312 may be provided. For example, in the region between the second and third doping regions 5312 and 5313, the plurality of dielectric materials 5112 which extend in the first direction, the plurality of pillars 5113 which are sequentially arranged in the first direction and pass through the plurality of dielectric materials 5112 in the second direction, the dielectric layer 5116 which is provided over the exposed surfaces of the plurality of dielectric materials 5112 and the plurality of pillars 5113, and the plurality of conductive materials 5212 to 5292 which extend in the first direction may be provided.

In the region between the third and fourth doping regions 5313 and 5314, the same structures as the structures between the first and second doping regions 5311 and 5312 may be provided. For example, in the region between the third and fourth doping regions 5313 and 5314, the plurality of dielectric materials 5112 which extend in the first direction, the plurality of pillars 5113 which are sequentially arranged in the first direction and pass through the plurality of dielectric materials 5112 in the second direction, the dielectric layer 5116 which is provided over the exposed surfaces of the plurality of dielectric materials 5112 and the plurality of pillars 5113, and the plurality of conductive materials 5213 to 5293 which extend in the first direction may be provided.

Drains 5320 may be respectively provided over the plurality of pillars 5113. For example, the drains 5320 may be silicon materials doped with second type impurities. For example, the drains 5320 may be silicon materials doped with n-type impurities. While it is assumed for the sake of convenience that the drains 5320 include n-type silicon, it is to be noted that the drains 5320 are not limited to n-type silicon. For example, the width of each drain 5320 may be larger than the width of each corresponding pillar 5113. For example, each drain 5320 may be provided in the shape of a pad over the top surface of each corresponding pillar 5113.

Conductive materials 5331 to 5333 which extend in the third direction may be provided over the drains 5320. The conductive materials 5331 to 5333 may be sequentially disposed in the first direction. The respective conductive materials 5331 to 5333 may be electrically coupled with the drains 5320 of corresponding regions. For example, the drains 5320 and the conductive materials 5331 to 5333 which extend in the third direction may be electrically coupled with each other through contact plugs. For example, the conductive materials 5331 to 5333 which extend in the third direction may be a metallic material. For example, the conductive materials 5331 to 5333 which extend in the third direction may be a conductive material such as polysilicon.

In FIGS. 5 and 6, the respective pillars 5113 may form strings together with the dielectric layer 5116 and the conductive materials 5211 to 5291, 5212 to 5292 and 5213 to 5293 which extend in the first direction. For example, the respective pillars 5113 may form NAND strings NS together with the dielectric layer 5116 and the conductive materials 5211 to 5291, 5212 to 5292 and 5213 to 5293 which extend in the first direction. Each NAND string NS may include a plurality of transistor structures TS.

Figure 7:
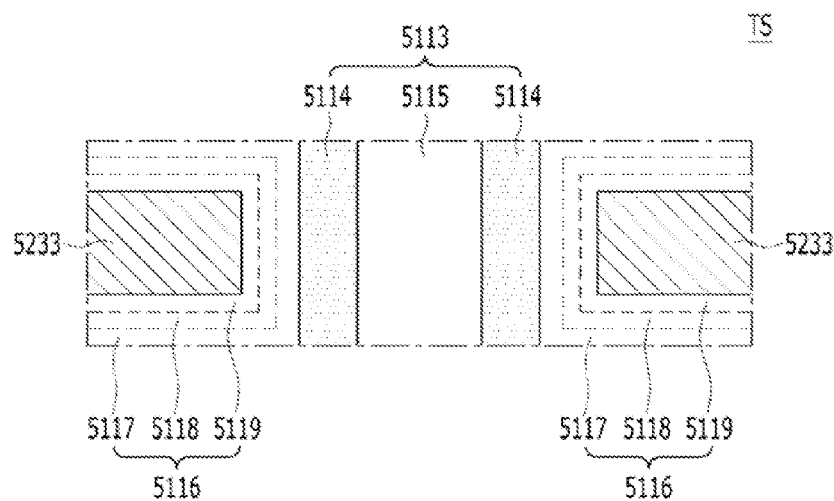

FIG. 7 is a cross-sectional view of the transistor structure TS shown in FIG. 6.

Referring to FIG. 7, in the transistor structure TS shown in FIG. 6, the dielectric layer 5116 may include first to third sub dielectric layers 5117, 5118 and 5119.

The surface layer 5114 of p-type silicon in each of the pillars 5113 may serve as a body. The first sub dielectric layer 5117 adjacent to the pillar 5113 may serve as a tunneling dielectric layer, and may include a thermal oxidation layer.

The second sub dielectric layer 5118 may serve as a charge storing layer. For example, the second sub dielectric layer 5118 may serve as a charge capturing layer, and may include a nitride layer or a metal oxide layer such as an aluminum oxide layer, a hafnium oxide layer, or the like.

The third sub dielectric layer 5119 adjacent to the conductive material 5233 may serve as a blocking dielectric layer. For example, the third sub dielectric layer 5119 adjacent to the conductive material 5233 which extends in the first direction may be formed as a single layer or multiple layers. The third sub dielectric layer 5119 may be a high-k dielectric layer such as an aluminum oxide layer, a hafnium oxide layer, or the like, which has a dielectric constant greater than the first and second sub dielectric layers 5117 and 5118.

The conductive material 5233 may serve as a gate or a control gate. That is, the gate or the control gate 5233, the blocking dielectric layer 5119, the charge storing layer 5118, the tunneling dielectric layer 5117 and the body 5114 may form a transistor or a memory cell transistor structure. For example, the first to third sub dielectric layers 5117 to 5119 may form an oxide-nitride-oxide (ONO) structure. In the embodiment, for the sake of convenience in explanation, the surface layer 5114 of p-type silicon in each of the pillars 5113 will be referred to as a body in the second direction.

The memory block BLKi may include the plurality of pillars 5113. Namely, the memory block BLKi may include the plurality of NAND strings NS. In detail, the memory block BLKi may include the plurality of NAND strings NS which extend in the second direction or a direction perpendicular to the substrate 5111.

Each NAND string NS may include the plurality of transistor structures TS which are disposed in the second direction. At least one of the plurality of transistor structures TS of each NAND string NS may serve as a source select transistor SST. At least one of the plurality of transistor structures TS of each NAND string NS may serve as a ground select transistor GST.

The gates or control gates may correspond to the conductive materials 5211 to 5291, 5212 to 5292 and 5213 to 5293 which extend in the first direction. In other words, the gates or the control gates may extend in the first direction and form word lines and at least two select lines, for example, at least one source select line SSL and at least one ground select line GSL.

The conductive materials 5331 to 5333 which extend in the third direction may be electrically coupled to one end of the NAND strings NS. For example, the conductive materials 5331 to 5333 which extend in the third direction may serve as bit lines BL. That is, in one memory block BLKi, the plurality of NAND strings NS may be electrically coupled to one bit line BL.

The second type doping regions 5311 to 5314 which extend in the first direction may be provided to the other ends of the NAND strings NS. The second type doping regions 5311 to 5314 which extend in the first direction may serve as common source lines CSL.

Namely, the memory block BLKi includes a plurality of NAND strings NS which extend in a direction perpendicular to the substrate 5111, e.g., the second direction, and may serve as a NAND flash memory block, for example, of a charge capturing type memory, in which a plurality of NAND strings NS are electrically coupled to one bit line BL.

While it is illustrated in FIGS. 5 to 7 that the conductive materials 5211 to 5291, 5212 to 5292 and 5213 to 5293 which extend in the first direction are provided in 9 layers it is to be noted that the conductive materials 5211 to 5291, 5212 to 5292 and 5213 to 5293 which extend in the first direction are not limited to being provided in 9 layers. For example, conductive materials which extend in the first direction may be provided in 8 layers, 16 layers or any multiple of layers. In other words, in one NAND string NS, the number of transistors may be 8, 16 or more.

While it is illustrated in FIGS. 5 to 7 that 3 NAND strings NS are electrically coupled to one bit line BL, it is to be noted that the embodiment is not limited to the fact that 3 NAND strings NS are electrically coupled to one bit line BL. For example, in the memory block BLKi, m number of NAND strings NS may be electrically coupled to one bit line BL, m being a positive integer. According to the number of NAND strings NS which are electrically coupled to one bit line BL, the number of conductive materials 5211 to 5291, 5212 to 5292 and 5213 to 5293 which extend in the first direction and the number of common source lines 5311 to 5314 may be controlled as well.

Further, while it is illustrated in FIGS. 5 to 7 that 3 NAND strings NS are electrically coupled to one conductive material which extends in the first direction, it is to be noted that the embodiment is not limited to the fact that 3 NAND strings NS are electrically coupled to one conductive material which extends in the first direction. For example, n number of NAND strings NS may be electrically coupled to one conductive material which extends in the first direction, n being a positive integer. According to the number of NAND strings NS which are electrically coupled to one conductive material which extends in the first direction, the number of bit lines 5331 to 5333 may be controlled as well.

Figure 8:
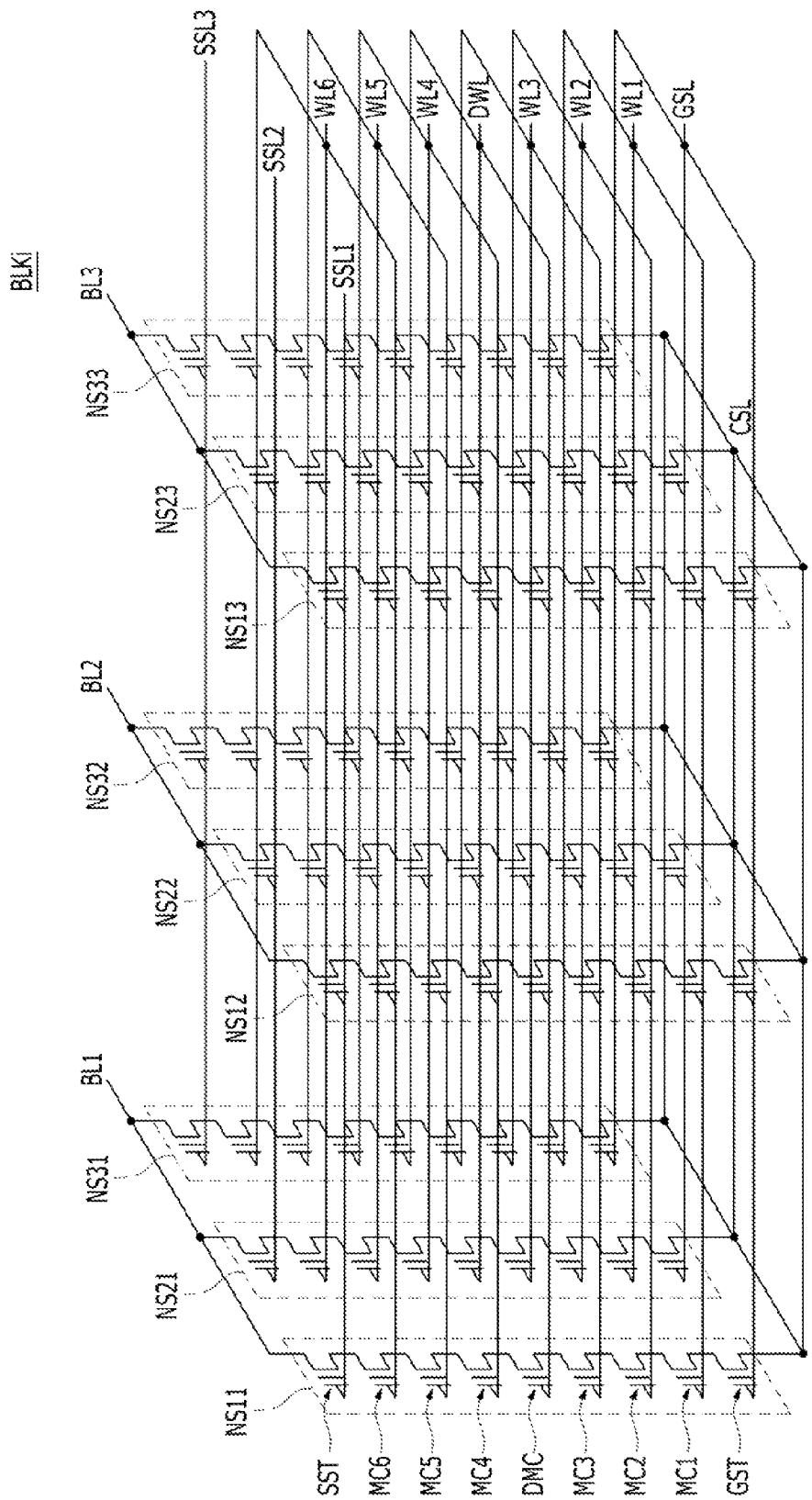

FIG. 8 is an equivalent circuit diagram illustrating the memory block BLKi having a first structure described with reference to FIGS. 5 to 7.

Referring to FIG. 8, in the certain block BLKi having the first structure, NAND strings NS11 to NS31 may be provided between a first bit line BL1 and a common source line CSL. The first bit line BL1 may correspond to the conductive material 5331 of FIGS. 5 and 6, which extends in the third direction. NAND strings NS12 to NS32 may be provided between a second bit line BL2 and the common source line CSL. The second bit line BL2 may correspond to the conductive material 5332 of FIGS. 5 and 6, which extends in the third direction. NAND strings NS13 to NS33 may be provided between a third bit line BL3 and the common source line CSL. The third bit line BL3 may correspond to the conductive material 5333 of FIGS. 5 and 6, which extends in the third direction.

A source select transistor SST of each NAND string NS may be electrically coupled to a corresponding bit line BL. A ground select transistor GST of each NAND string NS may be electrically coupled to the common source line CSL. Memory cells MC may be provided between the source select transistor SST and the ground select transistor GST of each NAND string NS.

In the embodiment, for the sake of convenience in explanation, it will be described as an example that NAND strings NS may be defined by the unit of row and column and NAND strings NS which are electrically coupled in common to one bit line may form one column. For example, the NAND strings NS11 to NS31 which are electrically coupled to the first bit line BL1 may correspond to a first column, the NAND strings NS12 to NS32 which are electrically coupled to the second bit line BL2 may correspond to a second column, and the NAND strings NS13 to NS33 which are electrically coupled to the third bit line BL3 may correspond to a third column. NAND strings NS which are electrically coupled to one source select line SSL may form one row. For example, the NAND strings NS11 to NS13 which are electrically coupled to a first source select line SSL1 may form a first row, the NAND strings NS21 to NS23 which are electrically coupled to a second source select line SSL2 may form a second row, and the NAND strings NS31 to NS33 which are electrically coupled to a third source select line SSL3 may form a third row.

In each NAND string NS, a height may be defined. For example, in each NAND string NS, the height of a memory cell MC1 adjacent to the ground select transistor GST is a value '1'. In each NAND string NS, the height of a memory cell may increase as the memory cell gets closer to the source select transistor SST when measured from the substrate 5111. In each NAND string NS, the height of a memory cell MC6 adjacent to the source select transistor SST is 7.

The source select transistors SST of the NAND strings NS in the same row may share the source select line SSL. The source select transistors SST of the NAND strings NS in different rows may be respectively electrically coupled to the different source select lines SSL1, SSL2 and SSL3.

The memory cells at the same height in the NAND strings NS in the same row may share a word line WL. That is, at the same height, the word lines WL electrically coupled to the memory cells MC of the NAND strings NS in different rows may be electrically coupled in common with one another. Dummy memory cells DMC at the same height in the NAND strings NS of the same row may share a dummy word line DWL. Namely, at the same height or level, the dummy word lines DWL electrically coupled to the dummy memory cells DMC of the NAND strings NS in different rows may be electrically coupled with one another.

For example, the word lines WL or the dummy word lines DWL located at the same level or height or layer may be electrically coupled in common with one another at layers where the conductive materials 5211 to 5291, 5212 to 5292 and 5213 to 5293 which extend in the first direction are provided. For example, the conductive materials 5211 to 5291, 5212 to 5292 and 5213 to 5293 which extend in the first direction may be electrically coupled in common to upper layers through contacts. At the upper layers, the conductive materials 5211 to 5291, 5212 to 5292 and 5213 to 5293 which extend in the first direction may be electrically coupled in common with one another. In other words, the ground select transistors GST of the NAND strings NS in the same row may share the ground select line GSL. Further, the ground select transistors GST of the NAND strings NS in different rows may share the ground select line GSL. That is, the NAND strings NS 11 to NS13, NS21 to NS23 and NS31 to NS33 may be electrically coupled in common to the ground select line GSL.

The common source line CSL may be electrically coupled in common to the NAND strings NS. For example, over the active regions over the substrate 5111, the first to fourth doping regions 5311 to 5314 may be electrically coupled with one another. For example, the first to fourth doping regions 5311 to 5314 may be electrically coupled to an upper layer through contacts and, at the upper layer, the first to fourth doping regions 5311 to 5314 may be electrically coupled in common with one another.

Namely, as shown in FIG. 8, the word lines WL of the same height or level may be electrically coupled in common with one another. Accordingly, when a certain word line WL at a specific height is selected, all NAND strings NS which are electrically coupled to the certain word line WL may be selected. The NAND strings NS in different rows may be electrically coupled to different source select lines SSL. Accordingly, among the NAND strings NS electrically coupled to the same word line WL, by selecting one of the source select lines SSL1 to SSL3, the NAND strings NS in the unselected rows may be electrically isolated from the bit lines BL1 to BL3. In other words, by selecting one of the source select lines SSL1 to SSL3, a row of NAND strings NS may be selected. Moreover, by selecting one of the bit lines BL1 to BL3, the NAND strings NS in the selected rows may be selected in units of columns.

In each NAND string NS, a dummy memory cell DMC may be provided. In FIG. 8, the dummy memory cell DMC is provided between a third memory cell MC3 and a fourth memory cell MC4 in each NAND string NS. That is, first to third memory cells MC1 to MC3 may be provided between the dummy memory cell DMC and the ground select transistor GST. Fourth to sixth memory cells MC4 to MC6 may be provided between the dummy memory cell DMC and the source select transistor SST. The memory cells MC of each NAND string NS may be divided into memory cell groups by the dummy memory cell DMC. In the divided memory cell groups, memory cells, for example, MC1 to MC3, adjacent to the ground select transistor GST, may be referred to as a lower memory cell group, and memory cells, for example, MC4 to MC6, adjacent to the source select transistor SST, may be referred to as an upper memory cell group.

Hereinbelow, detailed descriptions will be made with reference to FIGS. 9 to 11 for when the memory device in the memory system in accordance with the embodiment is implemented with a three-dimensional (3D) nonvolatile memory device of a structure different from the first structure.

Figure 9:
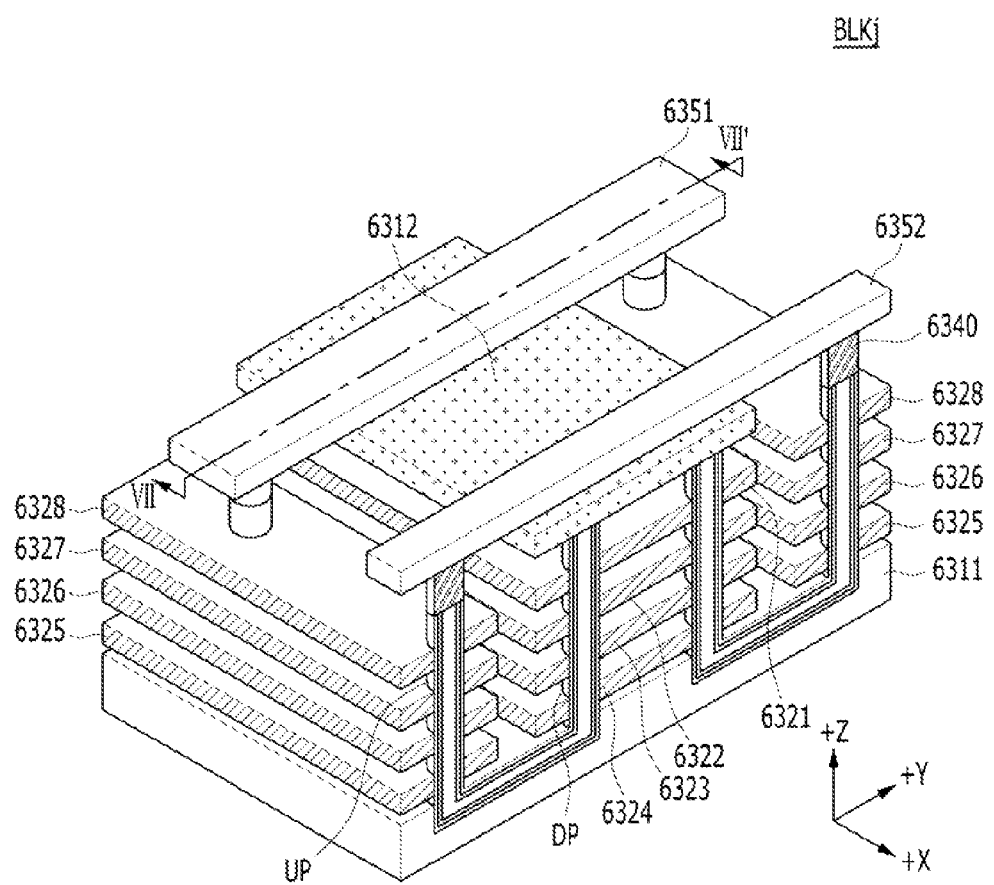
Figure 10:
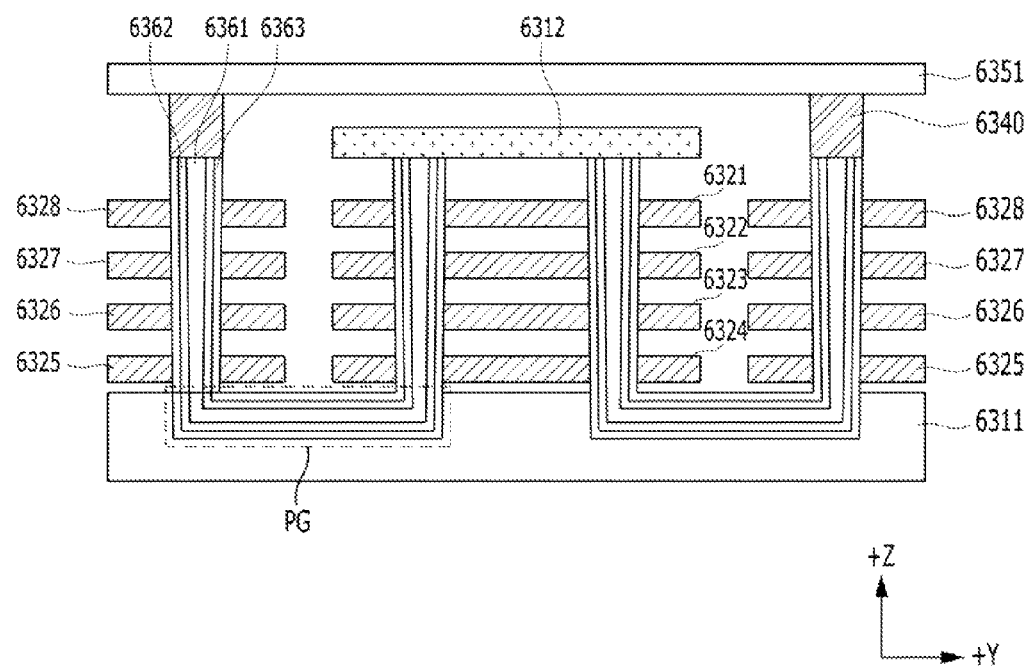

FIG. 9 is a perspective view schematically illustrating structures for when the memory device in accordance with the embodiment is implemented with a three-dimensional (3D) nonvolatile memory device of a second structure that is different from the first structure described above with reference to FIGS. 5 to 8 and showing a certain memory block BLKj having the second structure in the plurality of memory blocks of FIG. 4, and FIG. 10 is a cross-sectional view illustrating the certain memory block BLKj taken along the line VII-VII' of FIG. 9.

Referring to FIGS. 9 and 10 the certain memory block BLKj among the plurality of memory blocks of the memory device 150 of FIG. 1 may include structures which extend in the first to third directions.

A substrate 6311 may be provided. For example, the substrate 6311 may include a silicon material doped with a first type impurity. For example, the substrate 6311 may include a silicon material doped with a p-type impurity or may be a p-type well, for example, a pocket p-well, and include an n-type well which surrounds the p-type well. While it is assumed in the embodiment for the sake of convenience in explanation that the substrate 6311 is p-type silicon, it is to be noted that the substrate 6311 is not limited to p-type silicon.

First to fourth conductive materials 6321 to 5324 which extend in the x-axis direction and the y-axis direction are provided over the substrate 6311. The first to fourth conductive materials 6321 to 6324 are to be separated by a predetermined distance in the z-axis direction.

Fifth to eighth conductive materials 6325 to 6328 which extend in the x-axis direction and the y-axis direction are provided over the substrate 6311. The fifth to eighth conductive materials 6325 to 6328 are provided to be separated by the predetermined distance in the z-axis direction. The fifth to eighth conductive materials 6325 to 6328 are provided to be separated from the first to fourth conductive materials 6321 to 6324 in the y-axis direction.

A plurality of lower pillars DP which pass through the first to fourth conductive materials 6321 to 6324 are provided. Each lower pillar DP extends in the z-axis direction. Also, a plurality of upper pillars UP which pass through the fifth to eighth conductive materials 6325 to 6328 are provided. Each upper pillar UP extends in the z-axis direction.

Each of the lower pillars DP and the upper pillars UP includes an internal material 6361, an intermediate layer 6362, and a surface layer 6363. The intermediate layer 6362 serves as a channel of the cell transistor. The surface layer 6363 includes a blocking dielectric layer, a charge storing layer and a tunneling dielectric layer.

The lower pillar DP and the upper pillar UP are electrically coupled through a pipe gate PG. The pipe gate PG may be disposed in the substrate 6311. For instance, the pipe gate PG may include the same material as the lower pillar DP and the upper pillar UP.

A doping material 6312 of a second type which extends in the x-axis direction and the y-axis direction is provided over the lower pillars DP. For example, the doping material 6312 of the second type may include an n-type silicon material. The doping material 6312 of the second type serves as a common source line CSL.

Drains 6340 are provided over the upper pillars UP. For example, the drains 6340 may include an n-type silicon material. First and second upper conductive materials 6351 and 6352 which extend in the y-axis direction are provided over the drains 6340.

The first and second upper conductive materials 6351 and 6352 are separated in the x-axis direction. For example, the first and second upper conductive materials 6351 and 6352 may be formed of a metal. For instance, the first and second upper conductive materials 6351 and 6352 and the drains 6340 may be electrically coupled with each other through contact plugs. The first and second upper conductive materials 6351 and 6352 respectively serve as first and second bit lines BL1 and BL2.

The first conductive material 6321 serves as a source select line SSL, the second conductive material 6322 serves as a first dummy word line DWL1, and the third and fourth conductive materials 6323 and 5324 serve as first and second main word lines MWL1 and MWL2, respectively. The fifth and sixth conductive materials 6325 and 6326 serve as third and fourth main word lines MWL3 and MWL4, respectively, the seventh conductive material 6327 serves as a second dummy word line DWL2, and the eighth conductive material 6328 serves as a drain select line DSL.

The lower pillar DP and the first to fourth conductive materials 6321 to 6324 adjacent to the lower pillar DP form a lower string. The upper pillar UP and the fifth to eighth conductive materials 6325 to 6328 adjacent to the upper pillar UP form an upper string. The lower string and the upper string are electrically coupled through the pipe gate PG. One end of the lower string is electrically coupled to the doping material 6312 of the second type which serves as the common source line CSL. One end of the upper string is electrically coupled to a corresponding bit line through the drain 6340. One lower string and one upper string form one cell string which is electrically coupled between the doping material 6312 of the second type, serving as the common source line CSL, and a corresponding one of the upper conductive material layers 6351 and 6352, serving as the bit line BL.

That is, the lower string includes a source select transistor SST, the first dummy memory cell DMC1, and the first and second main memory cells MMC1 and MMC2. The upper string includes the third and fourth main memory cells MMC3 and MMC4, the second dummy memory cell DMC2, and a drain select transistor DST.

In FIGS. 9 and 10, the upper string and the lower string may form a NAND string NS, and the NAND string NS may include a plurality of transistor structures TS. Since the transistor structure included in the NAND string NS in FIGS. 9 and 10 is described above in detail with reference to FIG. 7, a detailed description thereof will be omitted herein.

Figure 11:
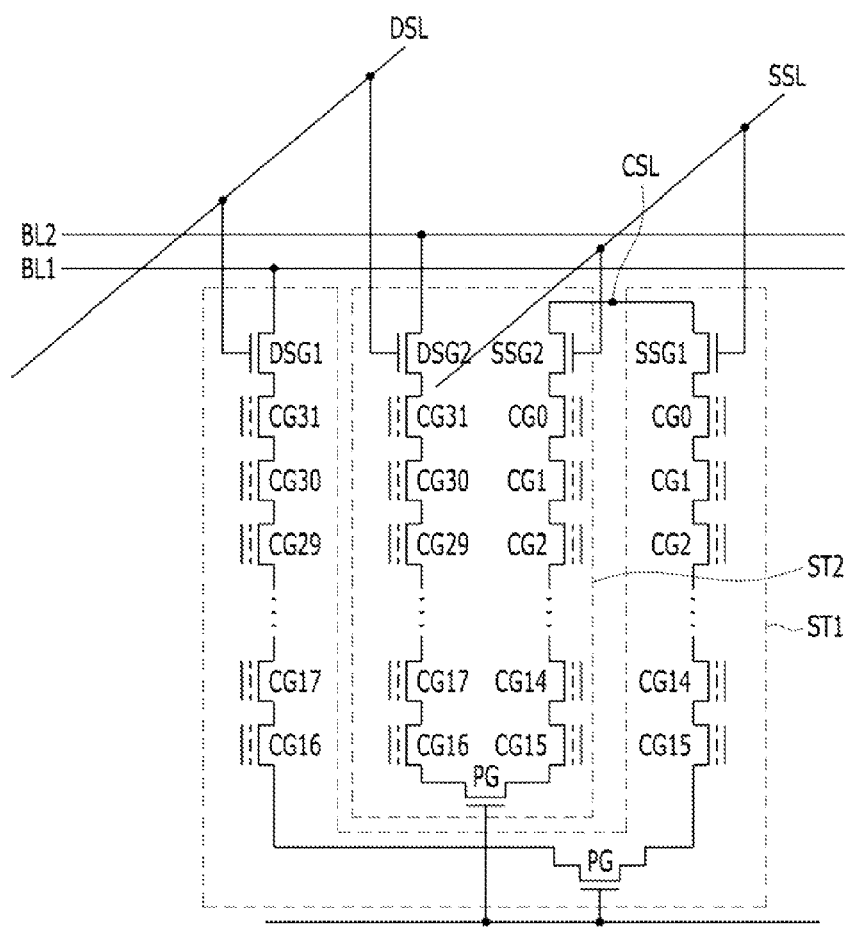

FIG. 11 is a circuit diagram illustrating the equivalent circuit of the memory block BLKj having the second structure as described above with reference to FIGS. 9 and 10. For the sake of convenience in explanation, only a first string and a second string, which form a pair in the certain memory block BLKj realized in the second structure, are shown.

Referring to FIG. 11, in the certain memory block BLKj having the second structure, among the plurality of blocks of the memory device 150, as described above with reference to FIGS. 9 and 10, cell strings, each of which is implemented with one upper string and one lower string are electrically coupled through the pipe gate PG, may be provided in such a way as to define a plurality of pairs.

Namely, in the certain memory block BLKj having the second structure, memory cells CG0 to CG31 stacked along a first channel CH1 (not shown), for example, at least one source select gate SSG1 and at least one drain select gate DSG1 may form a first string ST1, and memory cells CG0 to CG31 stacked along a second channel CH2 (not shown), for example, at least one source select gate SSG2 and at least one drain select gate DSG2 may form a second string ST2.

The first string ST1 and the second string ST2 are electrically coupled to the same drain select line DSL and the same source select line SSL. The first string ST1 is electrically coupled to a first bit line BL1, and the second string ST2 is electrically coupled to a second bit line BL2.

While it is described in FIG. 11 for the sake of convenience in explanation that the first string ST1 and the second string ST2 are electrically coupled to the same drain select line DSL and the same source select line SSL, it may be envisaged that the first string ST1 and the second string ST2 are electrically coupled to the same source select line SSL and the same bit line BL, the first string ST1 is electrically coupled to a first drain select line DSL1 and the second string ST2 is electrically coupled a second drain select line DSL2, or it may be envisaged that the first string ST1 and the second string ST2 are electrically coupled to the same drain select line DSL and the same bit line BL, the first string ST1 is electrically coupled to a first source select line SSL1 and the second string ST2 is electrically coupled a second source select line SSL2. Hereinbelow, detailed descriptions will be made with reference to FIGS. 12 to 14, for an operation for reading data from a memory device in the memory system in accordance with the embodiment.

Figure 12:
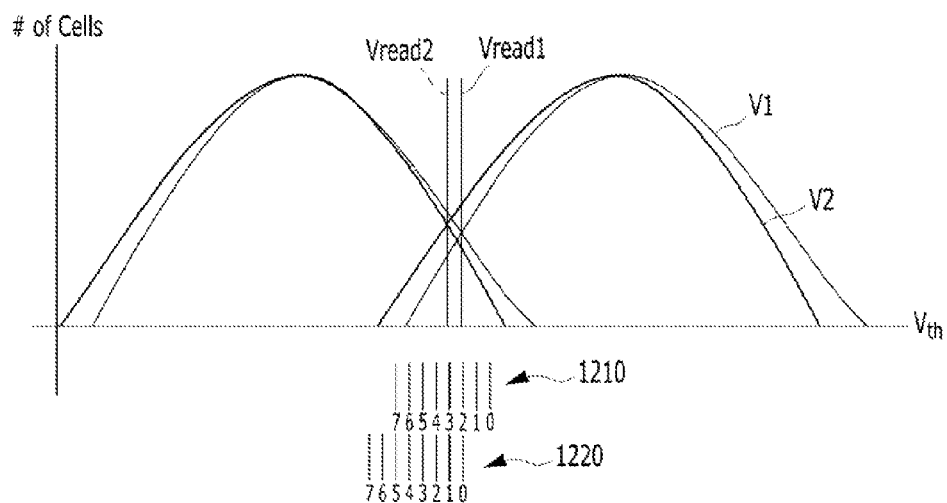
FIGS. 12 and 13 are schematic diagrams explaining an operation for determining a read voltage when reading data from a memory device, in a memory system in accordance with the embodiment.
Figure 13:
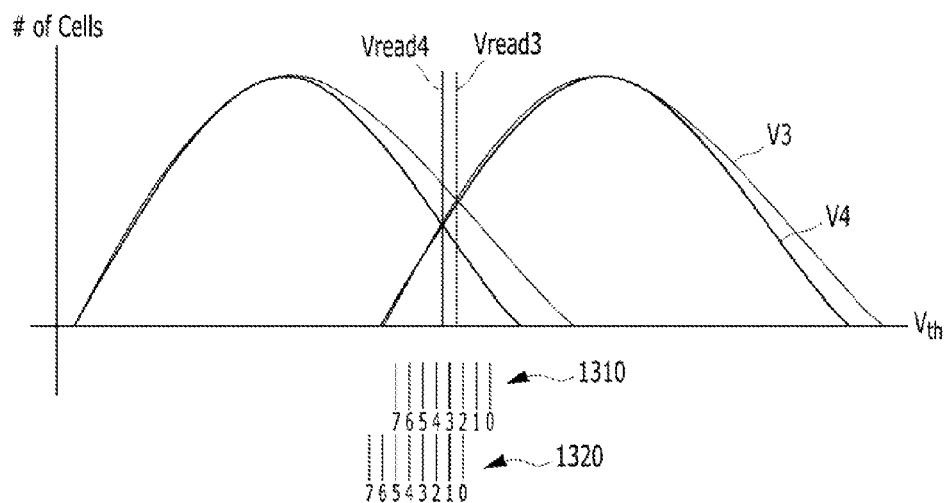

FIGS. 12 and 13 are schematic diagrams explaining an operation for determining a read voltage when reading data from a memory device, in the memory system in accordance with an embodiment.

Hereinafter, for the sake of convenience in explanation, an operation for determining a read voltage when data stored, that is, programmed, in a random memory cell among the memory cells included in the plurality of memory blocks 152, 154 and 156 of the memory device 150 shown in FIGS. 1 and 2 will be described as an example. Also, hereinafter, it will be described as an example for the sake of convenience in explanation that the controller 130 performs bad block management in the memory system. However, it is to be noted that, as described above, the processor 134 or the ECC unit 138 included in the controller 130 or a read voltage determining section included in the processor 134 or the ECC unit 138 may perform the operation for determining the read voltage.

First, referring to FIGS. 1 and 12, the controller 130 determines a read voltage to read data stored, that is, programmed, in a random memory cell. At this time, the controller 130 checks a temperature when the data is programmed in the random memory cell (hereinafter, referred to as a "data program temperature"), and a temperature when programmed data is read (hereinafter, referred to as a "data read temperature"). Information on the data program temperature may be stored in a flag cell included in the memory device 150, and accordingly, the controller 130 checks the data program temperature from the flag cell.

Also, information on the data read temperature may be included in the read command received from the host 102, and accordingly, the controller 130 checks the data read temperature from the read command received from the host 102. That is, since the host 102 provides the read command in which the information on the data read temperature is included, to the controller 130, the controller 130 checks the data read temperature from the read command. In another embodiment, the controller 130 may receive the information on the data read temperature from a temperature sensor which is included in the controller 130 or the memory device 150, that is, in the memory system 110. The temperature sensor senses the temperature of the random memory cell when the data programmed in the random memory cell is read, that is, the data read temperature, and provides the information on the data read temperature to the controller 130.

For the sake of convenience in explanation an example will be given where the data program temperature is lower than the data read temperature, for example, the data program temperature is in a cold state of 25° C. and the data read temperature is in a hot state of 87° C.

The controller 130 checks threshold voltage distributions of the random memory cell at the data program temperature and the data read temperature, respectively. In other words, as shown in FIG. 12, the controller 130 checks a threshold voltage distribution V1 of the random memory cell at the data program temperature, and checks a threshold voltage distribution V2 of the random memory cell at the data read temperature.

The controller 130 checks a first read voltage Vread1 from the threshold voltage distribution V1 at the data program temperature, and checks a second read voltage Vread2 from the threshold voltage distribution V2 at the data read temperature. Further, the controller 130 checks a first read retry table 1210 based on the first read voltage Vread1 at the data program temperature and a second read retry table 1220 in response to the second read voltage Vread2 at the data read temperature. In the first read retry table 1210 and the second read retry table 1220, a plurality of read bias levels 0, 1, 2, 3, 4, 5, 6 and 7 are included based on each of the first and second read voltages Vread1 and Vread2.

Furthermore, the controller 130 checks a normal read pass range at the data program temperature based on the first read voltage Vread1 and the first read retry table 1210 at the data program temperature, and checks a normal read pass range at the data read temperature based on the second read voltage Vread2 and the second read retry table 1220 at the data read temperature.

The controller 130 reads and acquires information on the data program temperature, the threshold voltage distribution V1 at the data program temperature, the first read voltage Vread1 from the threshold voltage distribution V1 and the first read retry table 1210 corresponding to the first read voltage Vread1, from the flag cell. Namely, the controller 130 acquires the information on the data program temperature, the threshold voltage distribution V1 at the data program temperature, the first read voltage Vread1 from the threshold voltage distribution V1 and the first read retry table 1210 corresponding to the first read voltage Vread1, by reading flag data from the flag cell. When programming data in the random memory cell, the controller 130 stores the information on the data program temperature, the threshold voltage distribution V1 at the data program temperature, the first read voltage Vread1 from the threshold voltage distribution V1 and the first read retry table 1210 corresponding to the first read voltage Vread1, in the flag cell. Accordingly, the controller 130 acquires the information by reading the flag data from the flag cell, to determine the read voltage when reading the data programmed in the random memory cell.

The controller 130 acquires information on the threshold voltage distribution V2 at the data read temperature, the second read voltage Vread2 from the threshold voltage distribution V2 and the second read retry table 1220 corresponding to the second read voltage Vread2 and, in particular, information on the second read voltage Vread2 at the data read temperature, through a page read operation. In detail, the controller 130 performs respective read operations for first pages of respective memory blocks, for example, a read operation on the data programmed in the random memory cell, at the read bias levels included in the first read retry table 1210, and determines a read bias level at which the number of read fail bits of the programmed data is smallest, as the second read voltage Vread2 at the data read temperature.

In this way, the controller 130 checks the threshold voltage distribution V1, the first read voltage Vread1, the first read retry table 1210 and the normal read pass range at the data program temperature, and the threshold voltage distribution V2, the second read voltage Vread2, the second read retry table 1220 and the normal read pass range at the data read temperature. Since the data program temperature is in the cold state and the data read temperature is in the hot state, as described above, offsets occur between the threshold voltage distribution V1, the first read voltage Vread1, the first read retry table 1210 and the normal read pass range at the data program temperature, and the threshold voltage distribution V2, the second read voltage Vread2, the second read retry table 1220 and the normal read pass range at the data read temperature. That is, since the data program temperature is in the cold state and the data read temperature is in the hot state, the threshold voltage distribution V2, the second read voltage Vread2, the second read retry table 1220 and the normal read pass range at the data read temperature are positioned left, that is, shifted leftward, when compared to the threshold voltage distribution V1, the first read voltage Vread1, the first read retry table 1210 and the normal read pass range at the data program temperature.

Therefore, the controller 130 calculates the offsets between the threshold voltage distribution V1, the first read voltage Vread1, the first read retry table 1210 and the normal read pass range at the data program temperature, and the threshold voltage distribution V2, the second read voltage Vread2, the second read retry table 1220 and the normal read pass range at the data read temperature, based on a difference between the data program temperature and the data read temperature. In particular, the controller 130 calculates a read voltage offset between the first read voltage Vread1 at the data program temperature and the second read voltage Vread2 at the data read temperature. The controller 130 calculates the read voltage offset based on the difference between the read bias levels included in the first read retry table 1210 and the read bias levels included in the second read retry table 1220, for example, calculates the read voltage offset as the read bias of 2 levels.

The controller 130 determines the read voltage for reading the data programmed in the random memory cell, by compensating the threshold voltage distribution V2, the second read voltage Vread2, the second read retry table 1220 and the normal read pass range at the data read temperature based on the calculated offsets, in particular, by compensating the second read voltage Vread2 based on the read voltage offset, and performs a read operation, that is, reads the data programmed in the random memory cell, based on the determined read voltage. As the second read voltage Vread2 is compensated by the read voltage offset, the read bias levels of the first read retry table 1210 are included in the normal read pass range at the data read temperature. Accordingly, the success rate of the read operation on the data programmed in the random memory cell may be improved, that is, the data programmed in the random memory cell may be normally read.

Hereinbelow, with reference to FIG. 13, an example will be given where the data program temperature is higher than the data read temperature, that is, where the data program temperature is in a hot state of 87° C. and the data read temperature is in a cold state of 25° C.

Referring to FIG. 13, the controller 130 checks a threshold voltage distribution V4, a fourth read voltage Vread4, a fourth read retry table 1320 and a normal read pass range at the data program temperature, and a threshold voltage distribution V3, a third read voltage Vread3, a third read retry table 1310 and a normal read pass range at the data read temperature. Since the data program temperature is in the hot state and the data read temperature is in the cold state as described above, offsets occur between the threshold voltage distribution V4, the fourth read voltage Vread4 the fourth read retry table 1320 and the normal read pass range at the data program temperature, and the threshold voltage distribution V3, the third read voltage Vread3, the third read retry table 1310 and the normal read pass range at the data read temperature. That is, since the data program temperature is in the hot state and the data read temperature is in the cold state, the threshold voltage distribution V3, the third read voltage Vread3, the third read retry table 1310 and the normal read pass range at the data read temperature are positioned right, that is, shifted rightward, when compared to the threshold voltage distribution V4, the fourth read voltage Vread4, the fourth read retry table 1320 and the normal read pass range at the data program temperature.

Therefore, the controller 130 calculates the offsets between the threshold voltage distribution V4, the fourth read voltage Vread4, the fourth read retry table 1320 and the normal read pass range at the data program temperature, and the threshold voltage distribution V3, the third read voltage Vread3, the third read retry table 1310 and the normal read pass range at the data read temperature, based on a difference between the data program temperature and the data read temperature. In particular, the controller 130 calculates a read voltage offset between the fourth read voltage Vread4 at the data program temperature and the third read voltage Vread3 at the data read temperature. The controller 130 calculates the read voltage offset based on the difference between read bias levels included in the fourth read retry table 1320 and read bias levels included in the third read retry table 1310, for example, calculates the read voltage offset as the read bias of 2 levels.

The controller 130 determines a read voltage for reading the data programmed in the random memory cell, by compensating the threshold voltage distribution V3, the third read voltage Vread3, the third read retry table 1310 and the normal read pass range at the data read temperature based on the calculated offsets, in particular, by compensating the third read voltage Vread3 based on the read voltage offset, and performs a read operation, that is, reads the data programmed in the random memory cell, based on the determined read voltage. As the third read voltage Vread3 is compensated based on the read voltage offset, the read bias levels of the fourth read retry table 1320 are included in the normal read pass range at the data read temperature. Accordingly, the success rate of the read operation on the data programmed in the random memory cell may be improved, that is, the data programmed in the random memory cell may be normally read.

Hereinbelow, an operation for reading data in the memory system in accordance with the embodiment will be described in detail with reference to FIG. 14.

Figure 14:
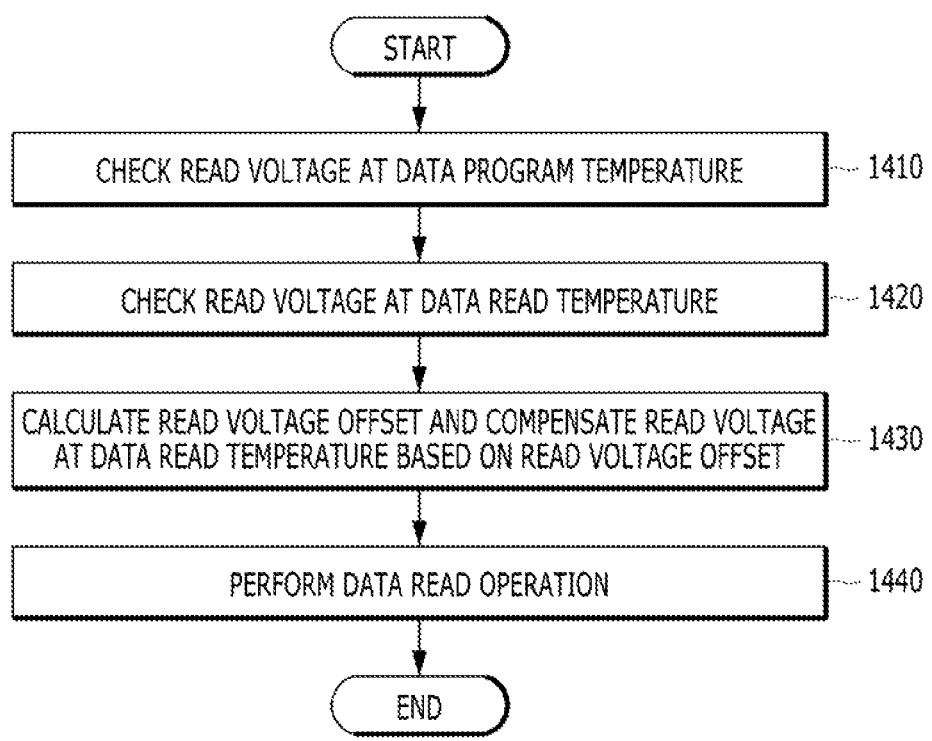
FIG. 14 is a flow chart explaining an operation process for reading data in a memory system in accordance with an embodiment.

FIG. 14 is a flow chart explaining an operation process for reading data in a memory system in accordance with an embodiment.

Referring to FIG. 14, at step 1410, the memory system checks a threshold voltage distribution, a read voltage, a read retry table and a normal read pass range at a data program temperature. In particular, the memory system checks the read voltage at the data program temperature, as described above.

At step 1420, the memory system checks a threshold voltage distribution, a read voltage, a read retry table and a normal read pass range at a data read temperature. In particular, the memory system checks the read voltage at the data read temperature.

At step 1430, the memory system calculates offsets between the threshold voltage distribution, the read voltage, the read retry table and the normal read pass range at the data program temperature, and the threshold voltage distribution, the read voltage, the read retry table and the normal read pass range at the data read temperature based on a difference between the data program temperature and the data read temperature. In particular, the memory system calculates a read voltage offset between the read voltage at the data program temperature and the read voltage at the data read temperature, the difference between the data program temperature and the data read temperature. The memory system determines a read voltage at the data read temperature by compensating the read voltage at the data read temperature based on the calculated read voltage offset. Since an operation for determining the read voltage, in particular, the operation for determining the read voltage for reading the data programmed in a random memory cell among the memory cells included in a plurality of memory blocks, when reading data from a memory device, has been described above in detail with reference to FIGS. 12 and 13, detailed descriptions thereof will be omitted herein.

At step 1440, the memory system performs a read operation based on the determined read voltage, that is, reads the data programmed in the random memory cell among the memory cells included in the plurality of memory blocks.

As is apparent from the above descriptions, the memory system and the operating method thereof according to the embodiments may normally read data from a memory device.

Although various embodiments have been described for illustrative purposes, it will be apparent to those skilled in the art that various changes and modifications may be made without departing from the spirit and scope of the invention as defined in the following claims.

What is claimed:
1. A memory system comprising:
a memory device including a plurality of memory blocks which include a plurality of memory cells electrically coupled to a plurality of word lines and store data requested from a host; and
a controller suitable for programming first data in a first memory cell among the plurality of memory cells based on a write command received from the host, determining a read voltage of the first memory cell, and reading the first data programmed in the first memory cell based on the read voltage in response to a read command received from the host,
wherein the controller determines the read voltage by checking a data program temperature when programming the first data in the first memory cell and checking a data read temperature when reading the programmed first data from the first memory cell.

2. The memory system according to claim 1, wherein the controller determines the read voltage by calculating a read voltage offset between a first read voltage at the data program temperature and a second read voltage at the data read temperature, for the first memory cell, and compensating the second read voltage based on the read voltage offset.

3. The memory system according to claim 2, wherein the controller checks a first threshold voltage distribution and a first read retry table at the data program temperature, for the first memory cell.

4. The memory system according to claim 3, wherein the controller reads information on the first read voltage, the first threshold voltage distribution and the first read retry table, from a flag cell included in the memory device.

5. The memory system according to claim 3, wherein the controller reads the first data programmed in the first memory cell at read bias levels included in the first read retry table, and determines a read bias level at which the number of read fail bits of the first data is smallest, as the second read voltage.

6. The memory system according to claim 5, wherein the controller calculates the read voltage offset based on a read bias level difference between the first read voltage and the second read voltage.

7. The memory system according to claim 5, wherein the controller checks a second threshold voltage distribution and a second read retry table at the data read temperature, for the first memory cell, based on the second read voltage.

8. The memory system according to claim 1, wherein the read command includes information on the data read temperature.

9. The memory system according to claim 1, further comprising:
a temperature sensor suitable for sensing the data read temperature, and providing information on the data read temperature to the controller.

10. A method of operating a memory system, the method comprising:
programming first data based on a write command received from a host, in a first memory cell among a plurality of memory cells which are included in a plurality of blocks of a memory device and are electrically coupled to a plurality of word lines;
determining a read voltage of the first memory cell; and
reading the first data programmed in the first memory cell, based on the read voltage, in response to a read command received from the host,
wherein the determining of the read voltage of the first memory cell comprises:
checking a data program temperature when programming the first data in the first memory cell and checking a data read temperature when reading the programmed first data from the first memory cell.

11. The method according to claim 10, wherein the determining of the read voltage of the first memory cell further comprises:
calculating a read voltage offset between a first read voltage at the data program temperature and a second read voltage at the data read temperature, for the first memory cell; and
compensating the second read voltage based on the read voltage offset, and determining the read voltage of the first memory cell.

12. The method according to claim 11, wherein the checking of the data program temperature comprises:
checking a first threshold voltage distribution and a first read retry table at the data program temperature, for the first memory cell.

13. The method according to claim 12, wherein the checking of the first threshold voltage distribution and the first read retry table comprises:
reading information on the first read voltage, the first threshold voltage distribution and the first read retry table, from a flag cell included in the memory device.

14. The method according to claim 12, wherein the checking of the data read temperature comprises:
reading the first data programmed in the first memory cell at read bias levels included in the first read retry table; and
determining a read bias level at which the number of read fail bits of the first data is smallest, as the second read voltage.

15. The method according to claim 14, wherein the calculating of the read voltage offset comprises:
calculating the read voltage offset based on a read bias level difference between the first read voltage and the second read voltage.

16. The method according to claim 14, wherein the checking of the data read temperature further comprises:
checking a second threshold voltage distribution and a second read retry table at the data read temperature, for the first memory cell, based on the second read voltage.

17. The method according to claim 10, wherein the read command includes information on the data read temperature.

18. The method according to claim 10, wherein the checking of the data read temperature comprises:
receiving information on the data read temperature from a temperature sensor of the memory device.

19. A memory system comprising:
a memory device including a plurality of memory blocks which include a plurality of memory cells electrically coupled to a plurality of word lines and store data requested from a host; and
a controller suitable for programming first data in a first memory cell among the plurality of memory cells based on a write command received from the host, determining a read voltage of the first memory cell, and reading the first data programmed in the first memory cell based on the read voltage in response to a read command received from the host.

* * * * *